(12) United States Patent
Sweeney et al.

(10) Patent No.: US 8,923,007 B2
(45) Date of Patent: Dec. 30, 2014

(54) MULTI-DIAMETER UNPLUGGED COMPONENT HOLE(S) ON A PRINTED CIRCUIT BOARD (PCB)

(75) Inventors: Michael Francis Sweeney, Portland, OR (US); Jorge Eduardo Martinez-Vargas, Jr., San Francisco, CA (US); Michael Clifford Freda, Morgan Hill, CA (US)

(73) Assignee: Oracle America, Inc., Redwood City, CA (US)

( * ) Notice: Subject to any disclaimer, the term of this patent is extended or adjusted under 35 U.S.C. 154(b) by 691 days.

(21) Appl. No.: 12/244,207

(22) Filed: Oct. 2, 2008

(65) Prior Publication Data

US 2010/0085717 A1   Apr. 8, 2010

(51) Int. Cl.
*H05K 1/18* (2006.01)
*H05K 3/34* (2006.01)
*H05K 1/11* (2006.01)

(52) U.S. Cl.
CPC .............. *H05K 3/3447* (2013.01); *H05K 1/116* (2013.01); *H05K 3/3484* (2013.01); *H05K 2201/09845* (2013.01)
USPC ........... 361/761; 361/772; 361/773; 174/262; 174/263; 174/264

(58) Field of Classification Search
USPC .......................... 174/262–268; 361/772–775
See application file for complete search history.

(56) References Cited

U.S. PATENT DOCUMENTS

| | | | | |
|---|---|---|---|---|
| 3,889,363 | A | * | 6/1975 | Davis .............................. 29/848 |
| 4,604,799 | A | * | 8/1986 | Gurol ............................. 29/847 |
| 4,787,853 | A | * | 11/1988 | Igarashi ......................... 439/55 |
| 5,487,218 | A | * | 1/1996 | Bhatt et al. ..................... 29/852 |
| 6,127,204 | A | * | 10/2000 | Isaacs et al. .................. 438/106 |
| 6,657,135 | B2 | * | 12/2003 | Suetsugu et al. .............. 174/262 |
| 2007/0202617 | A1 | * | 8/2007 | Hembree ........................ 438/17 |

* cited by examiner

*Primary Examiner* — Tuan T Dinh
(74) *Attorney, Agent, or Firm* — Brooks Kushman P.C.

(57) ABSTRACT

In at least one embodiment, a circuit board assembly that includes a printed circuit board is provided. The printed circuit board includes a top surface and a bottom surface for supporting at least one through-hole electrical component. The printed circuit board defines at least one component hole extending from the top surface to the bottom surface for receiving the at least one through-hole electrical component. The at least one component hole includes a first section having a first diameter and a second section having a second diameter. The first diameter is different from the second diameter. Each of the first and the second sections are configured to receive solder paste for forming a solder joint with the at least one through-hole electrical component.

3 Claims, 2 Drawing Sheets

MULTI-DIAMETER UNPLUGGED COMPONENT HOLE(S) ON A PRINTED CIRCUIT BOARD (PCB)

BACKGROUND

1. Technical Field

One or more embodiments of the present invention generally relate to at least one multi-diameter unplugged component hole on a printed circuit board.

2. Background Art

A PCB is generally flat, and is a multi-layer board made of fiberglass with copper tracks extending between the layers of the board. The PCB includes a plurality of component holes that connect the copper tracks from one layer of the board to other layers of the board. The component holes generally extend from a top surface of the board to a bottom surface of the board. Each component hole is cylindrical and includes a constant diameter therethrough (e.g., from the top surface of the PCB to the bottom surface of the PCB). Each component hole is configured to receive a lead of an electronic component (or through-hole electrical component). The lead of the electronic component may include a cross section that is cylindrical, square shaped, trapezoidal, or rectangular. Each component hole couples the lead to a corresponding track in a corresponding layer of the PCB. Solder is applied to the component hole to fixedly couple the lead of the electronic component to the corresponding track(s) of the PCB and to facilitate electrical communication therethrough.

It is also known that PCBs may include a plurality of pads positioned on the top surface that connect the copper tracks from one layer of the board to other layers of the board. A surface mount device (SMD) may be positioned on top of the pad (or lie on top of the pad). The pad is generally solid and fixedly couples the SMD to the corresponding track with solder to facilitate electrical communication between the SMD and the tracks. The process of coupling the SMDs and the through-hole electrical components to the PCB generally include two solder operations.

In a first operation, solder paste is applied to the pads of the PCB to temporarily hold the SMDs to corresponding pads. After the solder paste is applied, the PCBs with the SMDs positioned thereon are subjected to a reflow soldering process. The reflow soldering process generally includes applying heat in a controlled manner to solder the SMDs to the pads of the PCB. The source of the heat applied in the reflow process may include one or more of infrared lamp, oven, or hot air pencil.

In a second operation, the through-hole electrical components are inserted into corresponding component holes of the PCBs. Solder paste is generally applied to each component hole to temporarily hold the through-hole electrical components therein. The PCB with the through-hole electrical components is then drawn over the surface of a pool of molten solder in which all of the through-hole electronics are soldered to the component holes of the PCB at once. Such a process is known as a wave solder. Areas on the PCB around the component holes that do not need solder are protected by a solder mask. While the first and second operations are generally useful in soldering PCBs equipped with SMDs and through-hole electrical components, the second operation adds cycle time to the manufacturing process of generating a populated and soldered PCB. Further, the second operation may expose the through-hole electrical components and the SMDs to higher temperatures than that of the reflow solder process. Such exposure to increased levels of thermal exposure may decrease reliability.

SUMMARY

In at least one embodiment, a circuit board assembly that includes a printed circuit board is provided. The printed circuit board includes a top surface and a bottom surface for supporting at least one through-hole electrical component. The printed circuit board defines at least one component hole extending from the top surface to the bottom surface for receiving the at least one through-hole electrical component. The at least one component hole includes a first section having a first diameter and a second section having a second diameter. The first diameter is different from the second diameter. Each of the first and the second sections are configured to receive solder paste for forming a solder joint with the at least one through-hole electrical component.

In at least another embodiment, a method for constructing a circuit board assembly is provided. The method comprises providing a printed circuit board that includes a top surface and a bottom surface to support at least one through-hole electrical component. The method further comprises defining at least one component hole extending from the top surface to the bottom surface to receive the at least one through-hole electrical component. The at least one component hole includes a first section having a first diameter and a second section having a second diameter. The first diameter is different than the second diameter. The method further comprises receiving solder paste, at each of the first and the second sections to form a solder joint with the at least one through-hole electrical component.

In at least another embodiment, a circuit board assembly comprises a printed circuit board that includes a top surface and a bottom surface for supporting at least one through-hole electrical component. The printed circuit board defines at least one component hole extending from the top surface to the bottom surface for receiving the at least one through-hole electrical component. The at least one component hole includes a first section for storing a first amount of solder paste and a second section for storing a second amount of solder paste. The first amount of solder paste is greater than the second amount of solder paste and each of the first and the second sections are configured to form a solder joint with the at least one through-hole electrical component and the first and the second amounts of solder paste.

BRIEF DESCRIPTION OF THE DRAWINGS

The embodiments of the present invention are pointed out with particularity in the appended claims. However, other features of the various embodiments will become more apparent and will be best understood by referring to the following detailed description in conjunction with the accompany drawings in which:

DETAILED DESCRIPTION OF EMBODIMENTS OF THE INVENTION

Detailed embodiments of the present invention are disclosed herein. However, it is to be understood that the disclosed embodiments are merely exemplary of the invention that may be embodied in various and alternative forms. The figures are not necessarily to scale, some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the present invention.

Figure 1:
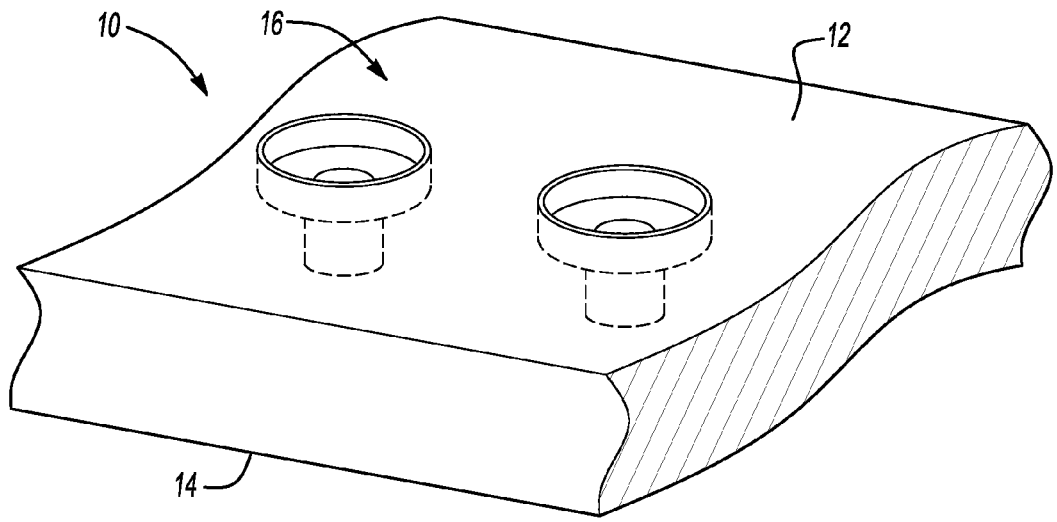
FIG. 1 depicts a perspective view of a PCB in accordance to one embodiment of the present invention.

Referring now to FIG. 1, a PCB 10 for use in various electrical devices in accordance to one embodiment of the present invention is shown. The PCB 10 includes a top surface 12 and a bottom surface 14 positioned opposite to the top surface 12. The PCB 10 includes at least one component hole 16 that extends therethrough (e.g., from the top surface 12 to the bottom surface 14). The component hole 16 is configured to receive a through-hole electrical component (not shown). The PCB 10 generally includes at least one layer (not shown) and a plurality of conductive tracks (not shown) positioned within one or more of the layers. The through-hole electrical component is generally positioned on the top surface 12 of the PCB 10. The through-hole electrical component may include at least one lead (not shown) for insertion from the top surface 12 through the component hole 16 of the PCB 10. The component hole 16 may also be recognized as a via or other such mechanism generally situated to receive solder paste and solder to couple an electronic component to a PCB.

Figure 2:
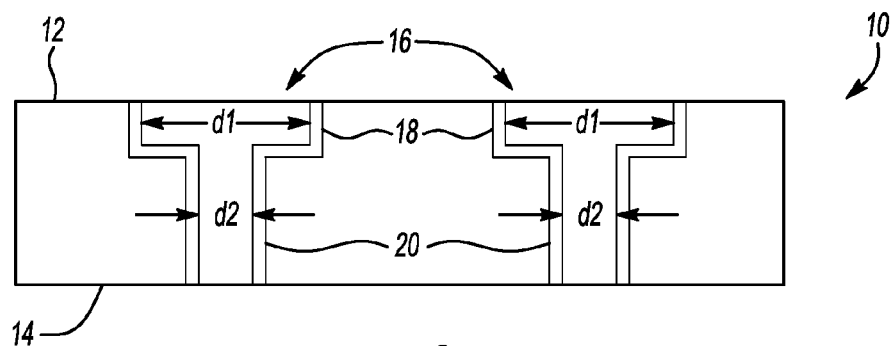
FIG. 2 depicts a cross-sectional view of the PCB in accordance to one embodiment of the present invention.

Referring now to FIG. 2, a cross-sectional view of the PCB 10 is shown in accordance to one embodiment of the present invention. The component hole 16 is generally arranged as a multi-diameter based hole for receiving the lead of the through-hole electrical component. The component hole 16 generally includes a first section 18 and a second section 20. The first section 18 is generally arranged to provide a greater volume capacity than that of the second section 20. The first section 18 is defined by a first diameter d1. The second section 20 is defined by a second diameter d2. While FIG. 2 generally depicts that the drill angle between the first diameter d1 and the second diameter d2 is ninety degrees, it is contemplated that the drill angle may have a slight to moderate angle.

The first diameter d1 is generally arranged such that the first diameter d1 is greater than the second diameter d2. The particular diameter of the first diameter d1 may vary based on the diameter of the lead of the through-hole electrical component that is inserted therein. In addition, the diameter (or dimensional attributes of the square based, rectangular, or trapezoidal cross sections) of the lead of the through-hole electrical component is generally considered when determining the amount of solder paste to use for placement within the first section 18. The volume of the first section 18 and/or the volume of the second section 20 is capable of storing more solder paste in comparison to the amount of solder paste that is capable of being stored in conventional component holes. The first diameter d1 may be in the range of 10 mm to 18 mm. The particular diameter of the second diameter may vary based on the desired criteria of a given implementation. It is generally contemplated that the PCB 10 may include a plurality of component holes positioned therethrough and that diameter of each component hole at the first section may be different from one another or similar to one another. Further, the PCB 10 may include similar diameters at the first section for at least two component holes and different diameters for any such remaining first sections of the component holes within the PCB 10. Likewise, it is generally contemplated that the diameter for each component hole at the second section may be different from one another or similar to one another. In addition, the PCB 10 may include similar diameters at the second section of at least two component holes and different diameters at the second sections for any remaining component holes.

In general, prior to soldering the through-hole electrical components to the component hole 16 via a reflow solder operation, solder paste may be applied over the entire top surface 12 of the PCB 10. The solder paste generally assists in cleaning the component hole and the bonding process between the solder, the component hole, and the through-hole electrical component. The first section 18 of the component hole 16 is generally configured to store (or accumulate) increased amounts of solder paste. The second section 20 is also generally configured to store (or accumulate) solder paste. The leads of the through-hole electrical components may be inserted into the first section 18 and down into the second section 20. The diameters of the first and the second sections coupled with the solder paste generally assist in keeping the through-hole electrical components in an upright position prior to the soldering operation being performed. During the reflow soldering process, the solder paste within the component hole 16 co-acts with the molten solder to form a solder joint. While applying the molten solder during the reflow solder operation, the molten solder generally flows down from the first section 18 to the second section 20 thereby fixing the through-hole electrical components to the PCB 10. The of the first section 18 is capable of receiving increased amounts of solder paste and solder due to its larger volume capacity. The increased amounts of solder paste cleans the component hole 16 and may increase the likelihood of the molten solder flowing down from the first section 18 into the second section 20 thereby allowing for a sufficient solder hole fill (or solder joint) within the component hole 16. Solder paste may burn off anywhere from 40% to 50% of its volume during the reflow soldering process as flux out-gasses are discharged from the solder paste. As such, a calculation of the amount of solder paste that is to be deposited into the first section 18 may be needed to account for the burn off. Further, such a calculation may consider the diameter of the lead of the through-hole electrical component. As noted above, solder paste increases the likelihood of having the molten solder flow from the first section 18 into the second section 18. As such, the first section 18 is generally completely filled with solder paste so that the solder joint is present in both the first section 18 and the second section 20.

Figure 3:
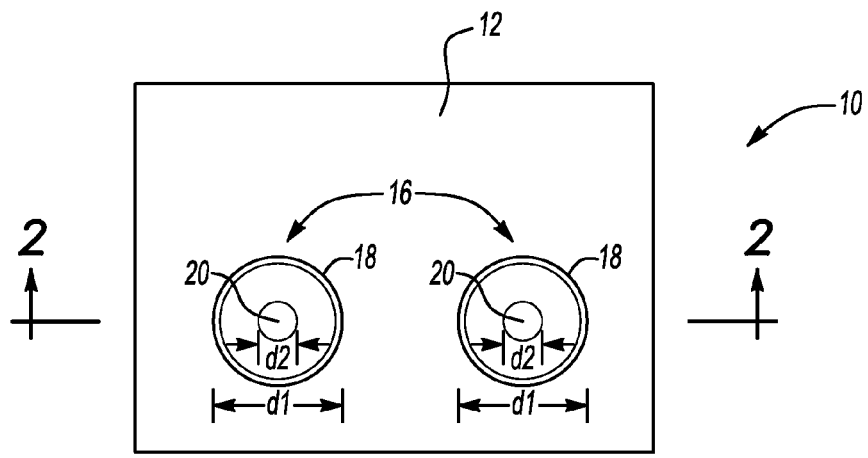
FIG. 3 depicts a top view of the PCB in accordance to one embodiment of the present invention.

Due to the increased amounts of solder that flows into the second section 20, the solder joint formed within the component hole 16 provides greater mechanical strength over that exhibited by conventional solder joints. In addition, more solder may result in a larger connection/contact area between the lead of the through-hole electrical component and the PCB 10. Since the lead of the through-hole electrical component and the PCB 10 expand at different rates when heated, such a condition may create stress between the lead and the PCB 10. Increased levels of solder may spread any such stress between the lead the PCB 10 over a larger contact area thereby minimizing the stress between such components. FIG. 3 depicts a top view of the PCB 10 of FIG. 2.

FIGS. 4A-4D depicts a plurality of operations for soldering and a SMD 31 and through-hole electrical components 42, 44 to a PCB 100' in accordance to one embodiment of the present invention.

At operation 50, the PCB 10' is fabricated or etched and includes a component hole 16', an SMD pad 32, and a conventional component hole 34. A Z-axis drill may be used to drill through the PCB 10 to produce the component hole 16' and the conventional component hole 34. As shown at operation 50, the component hole 16' includes a first section 18' and a second section 20'. The component hole 16' is constructed such that the diameter of the first section 18' is greater than the diameter of the second section 20'. The conventional component hole 34 is constructed such that the diameter of the component hole 34 is consistent from a top surface 12' of the PCB 10' through to a bottom surface 14' of the PCB 10'.

In general, the multiple diameters of the components holes 16' may be formed through the use of mechanical drills, end mills, lasers, and other suitable methods. With the mechanical drill, a first drill forms the second section 20' by drilling through the entire surface of the PCB 10'. After drilling the section 20', subsequent drilling operation from the top and/or bottom surface using larger diameter bits may be used to create the first section 16' to the component hole 16' by controlling the depth of the Z-axis. While two diameters are depicted in the figures, it is generally contemplated that the first and second sections for each component hole may take on different and/or similar diameters from additional first and second sections of various component holes in the PCB so long as the diameter of the first section remains greater than that of the second section.

At operation 52, a solder paste stencil 36 is positioned over the PCB 10'. Solder paste 38 is placed on top of the solder paste stencil 36. The solder paste stencil 36 is generally configured to prevent selected portions of the PCB 10' (e.g., on the top surface 12') from receiving the solder paste 38. Such selected portions of the PCB 10' may not have an electrical component positioned thereon, thus obviating the need to apply solder paste or having solder applied. The solder paste stencil 36 generally keeps the protected areas on the PCB 10 clean and free of unwanted debris. A squeegee 40 is used to move the solder paste 38 over the solder stencil 36 and into the component holes 16'. The squeegee 40 also moves the solder paste 38 over the SMD pad 32.

At operation 54, the PCB 10' is populated with through-hole electrical components 42, 44 and at least one SMD 31. The solder paste stencil 36 is removed prior to populating the PCB 10' to provide clearance for a pick and place machine (or other suitable apparatus) to place the through-hole electrical components 42, 44 and the SMD 31 on the PCB 10'. As illustrated in operation 54, leads of the through-hole electrical components 42, 44 are inserted through the solder paste 38 and into the component holes 16' and 34, respectively. The solder paste 38 generally assists in keeping the through-hole electrical components 42, 44 in an upright position prior to the soldering process being employed. The SMD 31 is placed on the SMD pad 32 and is generally held in place or bonded to the SMD pad 32 with the solder paste 38.

The solder paste is generally formed to provide sufficient tackiness to hold the through-hole components 42, 44 and the SMD 31 on the PCB 10' as the PCB 10' passes through the various manufacturing processes or is moved throughout the manufacturing floor. As exhibited in operation 54, the solder paste 38 is disposed within both of the first and the second sections 18 and 20.

At operation 56, the PCB 10' undergoes a reflow soldering process to bond the leads of the through-hole electrical components 42, 44 and the SMD 31 to the PCB 10' in a single solder step. Such a bond facilitates electrical communication (which includes an electrical and mechanical connection) between the through-hole electrical components 42, 44, the SMD 31 and the tracks within the layers of the PCB 10'. To bond the lead(s) of the conventional through-hole electrical component 44, an additional wave-solder operation is needed.

Figure 4A:
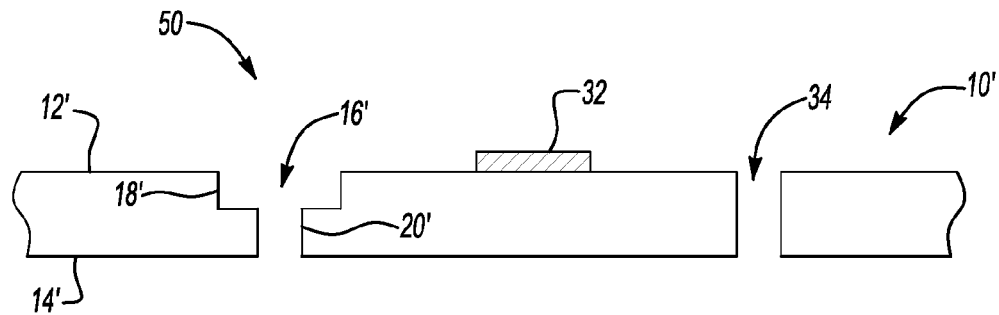
FIGS. 4A-4D depicts a plurality of operations for soldering through-hole electrical components and SMDs to the PCB in accordance to one embodiment of the present invention.
Figure 4B:
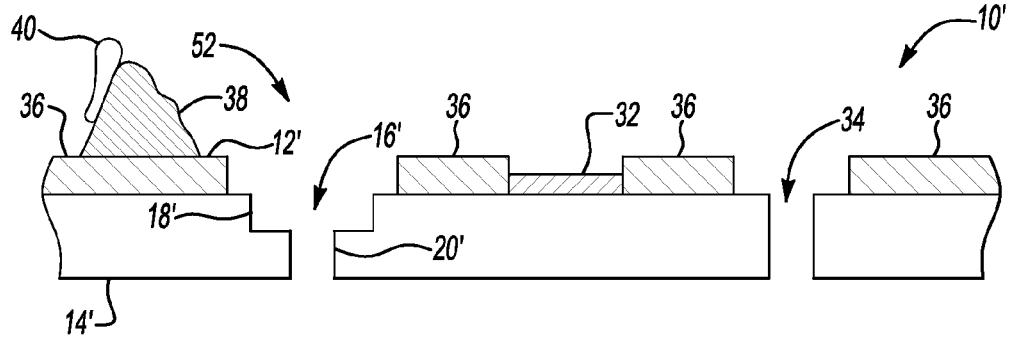
Figure 4C:
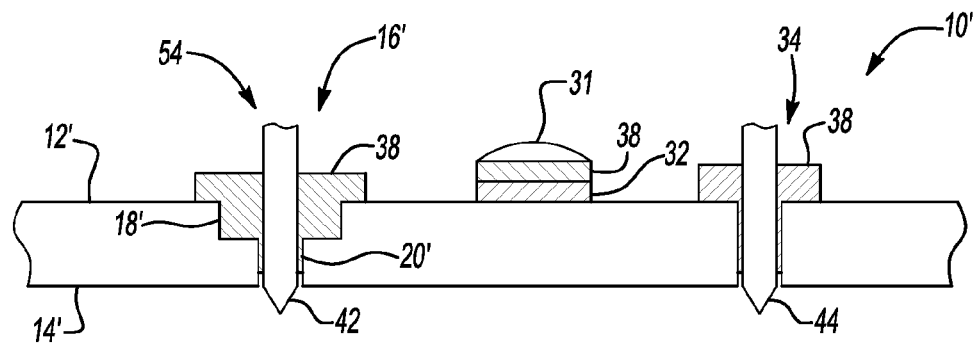
Figure 4D:
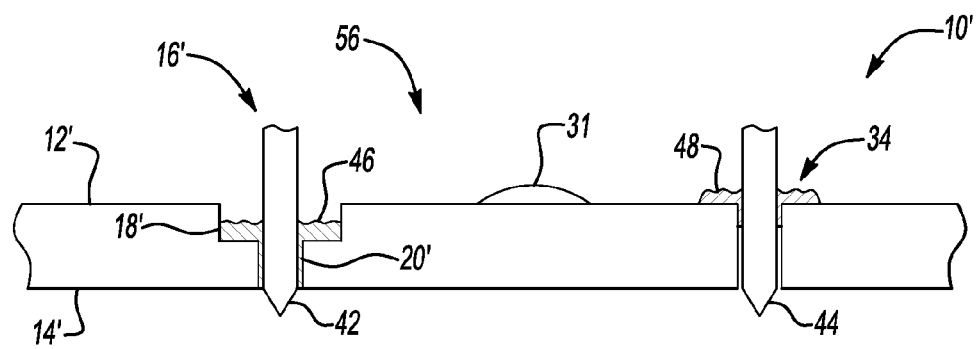

As noted above, the component hole 16' is configured to store more solder paste 38 than the component hole 34 due to the increased volume capacity of the first section 18'. Such a condition may allow for molten solder to flow from the first section 18' down into the second section 20 during the reflow solder operation. In general, the combination of solder paste and solder forms a solder joint that is used to bond the electronics to the PCB 10'. The presence of the solder paste 38 within the second section 20' forms a solder joint 46 with the lead of the through-hole electrical component 42, and the tracks (not shown) of the PCB 10' after the solder is applied to the PCB 10'. As depicted in FIG. 4D, the solder joint 46 is present in both the first section 18' and the second section 20' thereby providing for a larger solder joint than that of conventional solder joints. By increasing the size of the solder joint as exhibited at the component hole 16', increased electrical conductivity may be obtained between the leads of the through-hole electrical component 42 and the tracks of the PCB. In addition, the increased size of the solder joint within the component hole 16' may provide for increased mechanical strength. The increased diameter (or volume capacity) at the first section 18' of the component hole 16' generally facilitates an easier rework process as the increased diameter provides more access for a soldering iron. Such a condition may be more prevalent for thicker PCBs with heavy copper tracks or (planes).

Solder joint 48 of the component hole 34 is generally smaller in comparison to the solder joint 46 of the component hole 16'. Such a condition may cause for decreased electrical conductivity between the through-hole electrical component 44 and the tracks of the PCB 10'. In addition, the solder joint 48 may not provide as much mechanical strength in comparison to that exhibited at solder joint 46.

The operations as described above may eliminate the need to employ two soldering process that are generally used to solder SMD and through-hole electrical components to the PCB. As noted above in a conventional soldering process, a first reflow solder operation is performed to solder the SMD to the PCB and a second wave solder operation is later performed to solder the through-hole electrical components 44 to the PCB. With the operations noted in connection in FIGS. 4A-4D, the through-hole electrical component 42 and the SMD 31 may be soldered in a single reflow solder process thereby reducing cycle time associated in producing populated PCBs assuming the PCB 10' includes only the component holes 16' and not conventional component holes.

The wave solder operation may expose the through-hole electrical components and SMDs on the PCB to high thermal stress. By eliminating the wave solder process altogether, exposure of the high thermal stress may be minimized or altogether avoided. The reflow solder operation may apply heat in a carefully controlled manner in order to solder the through-hole electrical components and the SMDs to the PCB.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed:

1. A circuit board assembly comprising:
  a printed circuit board including a top surface and a bottom surface for supporting at least one through-hole electrical component; and
  wherein the printed circuit board defines at least one component hole extending from the top surface to the bottom surface for receiving the at least one through-hole electrical component, the at least one component hole includes a first section having a first diameter and a second section having a second diameter, the first diameter being greater than the second diameter, the first section being positioned below the top surface of the printed circuit board and the second section being positioned above the bottom surface of the printed circuit board, each of the first and the second sections receiving solder paste to form a solder joint with the at least one through-hole electrical component, and the first section being arranged to be substantially filled with solder paste to allow the solder joint to be present in both the first section and the second section, and wherein the at least one through-hole electrical component extends through the first section and the second section, at least one pad for receiving a surface mount device (SMD), the at least one pad being positioned about the at least one component hole for receiving the solder paste, wherein the at least one component hole and the at least one pad are configured to receive solder in a single solder operation such that a first solder joint is formed for the at least one through hole electrical component and a second solder joint is formed for the at least one SMD.

2. The circuit board assembly of claim 1 wherein the first section provides a first volume to store the solder paste and the second section provides a second volume to store the solder paste.

3. The circuit board assembly of claim 2 wherein the first volume is greater than the second volume.

* * * * *

UNITED STATES PATENT AND TRADEMARK OFFICE
CERTIFICATE OF CORRECTION

| | |
|---|---|
| PATENT NO. | : 8,923,007 B2 |
| APPLICATION NO. | : 12/244207 |
| DATED | : December 30, 2014 |
| INVENTOR(S) | : Sweeney et al. |

It is certified that error appears in the above-identified patent and that said Letters Patent is hereby corrected as shown below:

In the Specification

In column 4, line 26, after "The" delete "of the".

Signed and Sealed this
First Day of September, 2015

Michelle K. Lee
*Director of the United States Patent and Trademark Office*